(12) United States Patent
Liu et al.

(10) Patent No.: US 8,912,568 B2
(45) Date of Patent: Dec. 16, 2014

(54) SEMICONDUCTOR DEVICE AND MANUFACTURING METHOD THEREOF

(75) Inventors: Huanxin Liu, Beijing (CN); Huojin Tu, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 13/354,060

(22) Filed: Jan. 19, 2012

(65) Prior Publication Data

US 2012/0319168 A1 Dec. 20, 2012

(30) Foreign Application Priority Data

Jun. 20, 2011 (CN) .......................... 2011 1 0164686

(51) Int. Cl.
| | | |
|---|---|---|
| H01L 21/205 | (2006.01) | |
| H01L 29/12 | (2006.01) | |
| H01L 21/306 | (2006.01) | |
| H01L 29/78 | (2006.01) | |
| H01L 21/02 | (2006.01) | |
| H01L 29/04 | (2006.01) | |
| H01L 21/308 | (2006.01) | |

(52) U.S. Cl.
CPC .... H01L 21/02381 (2013.01); H01L 21/30608 (2013.01); H01L 21/3083 (2013.01); H01L 29/7848 (2013.01); H01L 21/02433 (2013.01); H01L 21/0243 (2013.01); H01L 21/02658 (2013.01); H01L 21/02532 (2013.01); H01L 29/045 (2013.01); H01L 21/02639 (2013.01)

USPC ............ 257/192; 257/E21.618; 257/E21.619; 257/E21.633; 257/E21.634; 257/E29.255; 438/199; 438/278; 438/504

(58) Field of Classification Search
USPC .................. 438/199, 278, 300, 504, 745, 753
See application file for complete search history.

(56) References Cited

U.S. PATENT DOCUMENTS

| 5,739,544 | A * | 4/1998 | Yuki et al. ........................ 257/25 |
| 8,232,172 | B2 * | 7/2012 | Adam et al. .................. 438/300 |
| 2009/0302348 | A1 | 12/2009 | Adam et al. |
| 2011/0104875 | A1 * | 5/2011 | Wojtczak et al. ............. 438/478 |
| 2012/0225557 | A1 * | 9/2012 | Serry et al. .................... 438/694 |

OTHER PUBLICATIONS

E. Chen, Applied Physis 298r, "Wet and Dry Etching" (p. 1-18) Apr. 12, 2004.*
Office Action from corresponding Chinese Patent Application No. 201110164686.4, dated Jul. 2, 2014.

* cited by examiner

*Primary Examiner* — Fernando L Toledo
*Assistant Examiner* — Lawrence-Linh T Nguyen
(74) *Attorney, Agent, or Firm* — Koppel, Patrick, Heybl & Philpott; Michael J. Ram

(57) ABSTRACT

A semiconductor device and manufacturing method therefor includes a Σ-shaped embedded source or drain regions. A U-shaped recess is formed in a Si substrate using dry etching and a SiGe layer is grown epitaxially on the bottom of the U-shaped recess. Using an orientation selective etchant having a higher etching rate with respect to Si than SiGe, wet etching is performed on the Si substrate sidewalls of the U-shaped recess, to form a Σ-shaped recess.

13 Claims, 3 Drawing Sheets

SEMICONDUCTOR DEVICE AND MANUFACTURING METHOD THEREOF

CROSS-REFERENCE TO RELATED APPLICATIONS

This application claims priority to Chinese Patent Application No. 201110164686.4, filed on Jun. 20, 2011 and entitled "SEMICONDUCTOR DEVICE AND MANUFACTURING METHOD THEREOF", which is incorporated herein in its entirety by reference.

BACKGROUND OF THE INVENTION

1. Field of the Invention

The present invention relates to semiconductor device and manufacturing method thereof, and particularly to a semiconductor device having Σ-shaped embedded source and drain regions and a manufacturing method thereof.

2. Description of the Related Art

In CMOS devices, techniques to embed SiGe have been proposed to increase compressive stress in the channel region of a PMOS device, so as to improve carrier mobility, wherein source and drain regions are formed from embedded SiGe to apply stress to the channel region.

In order to enhance the effect of applying stress, a procedure for forming a Σ-shaped recess for filling with SiGe is further provided.

FIG. 1 schematically illustrates a cross-sectional view of a Σ-shaped recess formed in a substrate. In the cross-sectional view, a "Σ" shape is formed through the surface 130 of the substrate 100, comprising the upper portion 140, a lower portion 150 of the recess sidewall and the recess bottom 180 indicated by the extending line 160 (denoted by dotted line).

The Σ-shaped recess shown in FIG. 1 can be formed by orientation selectivity wet etching.

For example, the surface of substrate 100 can be a (001) crystal plane. As shown in FIG. 2A, first, a U-shaped recess 210 is formed in the substrate through, for example, dry etching. The bottom of recess 210 is also a (001) crystal plane, while the sidewall may be a (110) crystal plane.

Next, a wet etchant having orientation selectivity, such as an etchant comprising Tetramethyl ammonium hydroxide (TMAH), is utilized to etch the substrate 100 from the U-shaped recess 210. During the etching process, the etching rate of <111> orientation is less than that of other orientation. Thereby, the U-shaped recess 210 is etched into a diamond-shaped recess 215 as shown in FIG. 2B. The location of the original U-shaped recess 210 is shown by the dotted line in FIG. 2B. The sidewall of the recess 215 has an upper portion 240 and a lower portion 250, which substantially have (111) and (11$\bar{1}$) orientation, respectively.

However, since the etching rate of <100> and <110> orientation is larger than that of <111> orientation, the bottom of the recess 215 is liable to be overetched, causing the lower portion 250 of the opposite sidewalls of the recess 215 to intersect with each other. Therefore, the bottom of the recess 215 is cuspate but not flat as the result of anisotropic etching.

If the recess 215 has a cuspate bottom, high quality SiGe cannot be obtained when performing epitaxial growth of SiGe in the recess 215.

SUMMARY OF THE INVENTION

One object of this invention is to provide a method of manufacturing a semiconductor device which is capable of preventing the generation of a cuspate bottom when forming a Σ-shaped recess.

According to a first aspect of the invention, a method of manufacturing a semiconductor device is provided, comprising forming a U-shaped recess in a Si substrate, forming a SiGe layer on the bottom of the U-shaped recess through epitaxial growth, performing wet etching having orientation selectivity on the Si substrate of the sidewall of the U-shaped recess by using an etchant having a higher etching rate with respect to Si as compared to SiGe, so as to form a Σ-shaped recess.

Preferably, the method further comprises filling the Σ-shaped recess by epitaxial growth of SiGe in the Σ-shaped recess.

Preferably, the SiGe filled in the Σ-shaped recess is used to form source or drain regions of a PMOS device.

Preferably, the U-shaped recess can be formed through a dry etching process.

Preferably, the depth of the U-shaped recess is about 300 Å to 550 Å.

Preferably, The surface of the substrate and the sidewalls of the U-shaped recess comprise substantially {100} and {110} crystal plane families and are substantially orthogonal to each other. In the above wet etching having orientation selectivity, the etching rate of <111> orientation is lower than that of other orientations.

Preferably, the surface of the substrate is substantially a (001) crystal plane, and the sidewalls of the U-shaped recess are substantially a (110) crystal plane.

Preferably, the etchant includes TMAH.

Preferably, in the step of forming a SiGe layer on the bottom of the U-shaped recess through epitaxial growth, a SiGe thin film is also formed on the sidewalls of the U-shaped recess, the thickness of which is less than the thickness of the SiGe layer on the bottom of the U-shaped recess, the method may further comprise etching to remove the thin SiGe film on the sidewalls while retaining at least a portion of the SiGe layer on the bottom of the U-shaped recess to cover the Si at the bottom of the U-shaped recess before wet etching the Si substrate.

In the step of forming a SiGe layer on the bottom of the U-shaped recess through epitaxial growth, preferably, the process temperature is 500° C. to 800° C., and the process pressure is 5 Torr to 50 Torr. Preferably, the process gases include one or more of $SiH_4$ or $SiH_2Cl_2$;

$GeH_4$;

HCl;

$B_2H_6$ or $BH_3$; and $H_2$, wherein the flow rate of $H_2$ is 0.1 slm to 50 slm, and the flow rates of the other gases above are 1 sccm to 1000 sccm.

Preferably, the thickness of the SiGe layer may be 10 Å to 300 Å.

According to a second aspect of this invention, a semiconductor device is provided, comprising a Si substrate with a recess formed therein and SiGe material used to fill the recess to form source or drain regions of a PMOS device, wherein the recess has a first portion and a second portion. The surface of the substrate and the sidewalls of a first portion comprise {100} and {110} crystal plane families and are substantially orthogonal to each other and a second portion is located above the first portion. The sidewalls of the second portion are divided into an upper part and a lower part, which are substantially (111) and (11$\bar{1}$) crystal planes, respectively.

Preferably, the surface of the substrate is substantially a (001) crystal plane, and the sidewalls of the first portion is substantially a (110) crystal plane.

Preferably, the height of the first portion may be 10 Å to 300 Å.

One advantage of the embodiments of this invention is that the Si at the bottom of the recess is protected from being etched in the wet etching process, and therefore, prevented from forming a cuspate bottom in the process of forming the Σ-shaped recess.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

With reference to the drawings, the present invention can be understood more clearly from the detailed description below.

DESCRIPTION OF THE EMBODIMENTS

Figure 1:
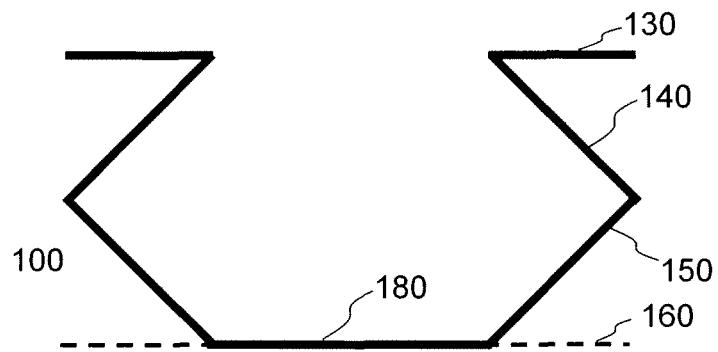
FIG. 1 is a cross-sectional view schematically showing a Σ-shaped recess.
Figure 2A:
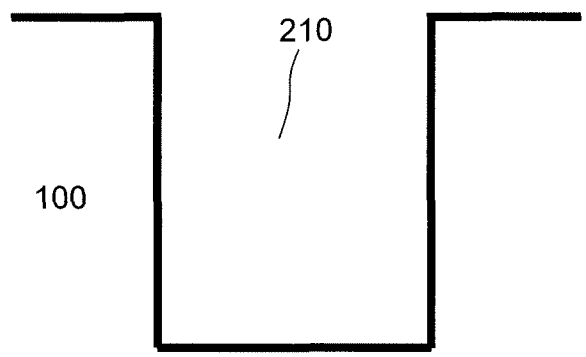
FIGS. 2A and 2B are cross-sectional views schematically showing the respective steps of the process of forming a Σ-shaped recess in prior art.
Figure 2B:
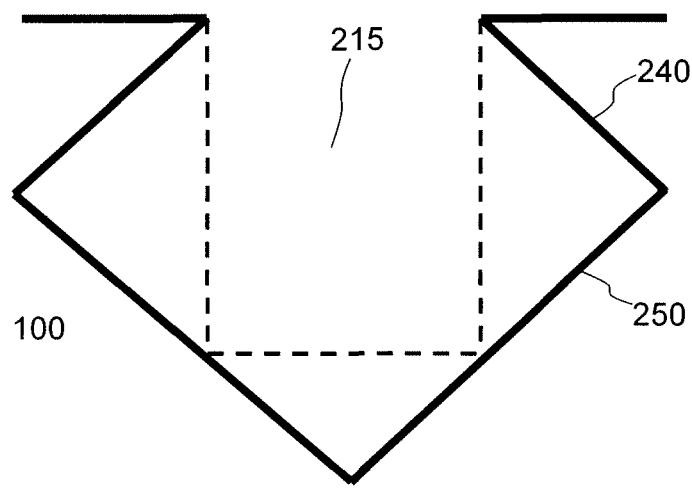

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

Also, it should be appreciated that, for the convenience of description, various parts are not illustrated in actual proportion in the drawings.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

It should be noticed that similar reference numerals and letters refer to similar items in the following figures, and thus once an item is defined in one figure, it is possible that it is not further discussed for following figures.

As known in the art, the {100} crystal plane family includes (100), (010) and (001) crystal planes. The {110} crystal plane family includes (110), (101), (011), (1$\overline{1}$0), (10$\overline{1}$) and (01$\overline{1}$) crystal planes, and the {111} crystal plane family includes (111), ($\overline{1}$11), (1$\overline{1}$1) and (11$\overline{1}$) crystal planes.

As known in the art the <100> crystal orientation family comprises [100], [010] and [001] crystal orientation, the <110> crystal orientation family comprises [110], [101], [011], [1$\overline{1}$0], [10$\overline{1}$] and [01$\overline{1}$] crystal orientation. The <111> crystal orientation family comprises [111], [$\overline{1}$11], [1$\overline{1}$1] and [11$\overline{1}$] crystal orientation. For the convenient of description, the "crystal orientation family" is referred to as "crystal orientation". For example, "<111> crystal orientation" refers to "<111> crystal orientation family".

Below, the method of manufacturing semiconductor devices incorporating features of the present invention will be discussed with reference to the cross-sectional views of the respective steps shown in FIGS. 3A to 3D and the flowchart shown in FIG. 4.

Semiconductor devices, especially CMOS devices, always contain not only NMOS but also PMOS devices.

Source or drain regions formed from embedded SiGe are usually used in PMOS devices. Hence, before the implementation of each step discussed below, portions to be used for forming NMOS devices should be covered with a mask to expose merely those portions used for PMOS devices, consequently, recesses are merely formed and filled with SiGe embedded in those portions used for PMOS devices.

Figure 3A:
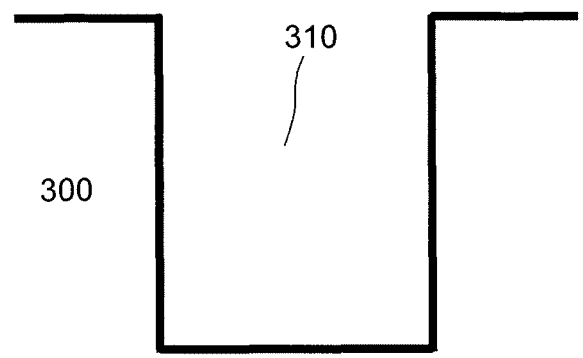
FIGS. 3A to 3D are cross-sectional views schematically showing the respective steps of a method of manufacturing semiconductor devices according to the present invention.
Figure 3B:
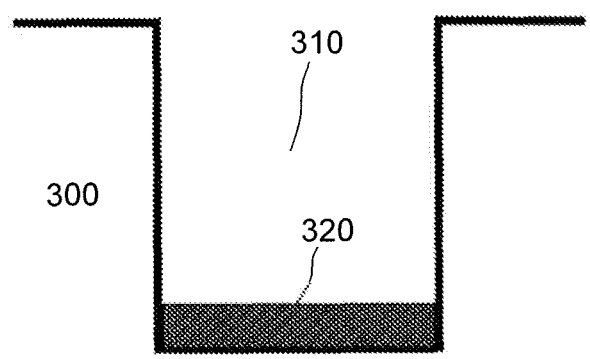
Figure 4:
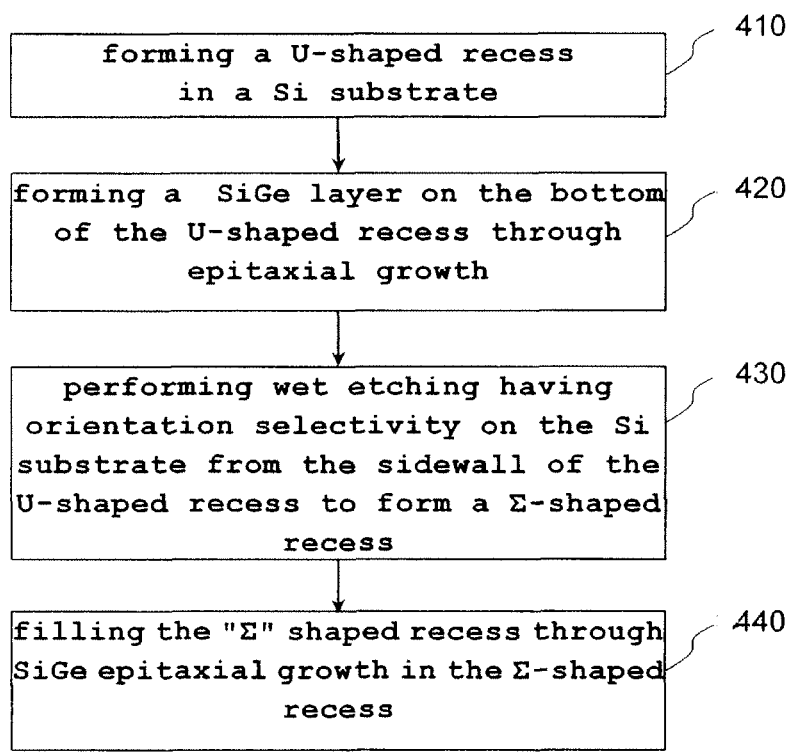
FIG. 4 shows a flowchart of the method of manufacturing semiconductor device according to the present invention.

First, at step 410, a U-shaped recess 310 is formed in a substrate 300 as shown in FIG. 3A. The material of the substrate 300 can be, for example, Si.

The U-shaped recess 310 can be formed through a well-known dry etching process.

The substrate 300 can be etched using a gate and a gate sidewall spacer (both are not shown) formed thereon as a mask to form the U-shaped recess 310.

The depth of the U-shaped recess 310 can be formed to the expected depth of source or drain regions. In a preferred example, the depth may be 300 Å to 550 Å.

The bottom of the U-shaped recess 310 can be substantially parallel to the surface of the substrate. The sidewalls of the U-shaped recess 310 can be substantially vertical to surface of the substrate.

The surface of the substrate and the sidewalls of the U-shaped recess can comprise {100} and {110} crystal plane families, respectively.

For example, when the surface of the substrate is a (001) crystal plane, the sidewalls of the U-shaped recess may be a (110), (1$\overline{1}$0), (100), or (010) crystal planes.

When the surface of the substrate is a (110) crystal plane, the sidewalls of the U-shaped recess may be a (1$\overline{1}$0) or (001) crystal planes.

Considering that the surface of wafers commonly used at present is a (001) crystal plane, it is more convenient if the crystal plane of the surface of the substrate is a (001) crystal plane.

When the channel orientation comprises a <110> crystal orientation to obtain greater carrier mobility, the sidewalls of the U-shaped recess can be substantially a (110) or (1$\overline{1}$0) crystal planes.

In the embodiments herein where surface of the substrate is a (001) crystal plane, when referring to "(11x) crystal plane", it means to encompass (11x) and (1$\overline{1}$x) crystal planes, wherein the "x" denotes "0" "1" or "$\overline{1}$".

Next, at step 420, a SiGe layer 320 is formed on the bottom of the U-shaped recess 310 through epitaxial growth.

Standard SiGe epitaxial growth processes are bottom-up processes, essentially growing up from the bottom and thus having a relative slower growth speed at the sidewalls. Therefore, the thickness of the SiGe grown on the sidewall (if any) is very small in comparison to the thickness of the SiGe grown on the bottom.

Through selecting process gases and conditions of the epitaxial growth, it is possible to make the growth speed at the sidewalls far lower than that of the bottom-up growth.

For example, the process gases may comprise one or more of

SiH$_4$ or SiH$_2$Cl$_2$;
GeH$_4$;
HCl;
B$_2$H$_6$ or BH$_3$; and
H$_2$, wherein the flow rate of H$_2$ may be 0.1 slm to 50 slm, and the flow rates of the other gases above can be 1 sccm to 1000 sccm.

The process temperature may be 500° C. to 800° C., and the process pressure can be 5 Torr to 50 Torr.

The thickness of the SiGe layer 320 thus formed may be, for example, 10 Å to 300 Å.

As indicated above, it is also possible to form a relatively thinner film of SiGe (not shown) on the sidewalls of the U-shaped recess, the thickness of which is less than that of the SiGe layer on the bottom. In one embodiment, the SiGe grown on the sidewall is merely 1 nm-2 nm thick while the SiGe epitaxially grown at the bottom is 14.3 nm thick.

The thin SiGe film on the sidewalls can be removed through an additional etching step before the wet etching process described below. Also, the thin SiGe film on the sidewall may be removed through the following described wet etching process before etching the Si substrate.

While etching to remove the thin SiGe film, a fraction of the bottom SiGe layer might be lost. Nevertheless, at least a portion of the SiGe will be always retained due to its larger thickness so as to cover the Si at the bottom of the U-shaped recess.

Next, at step 430, wet etching having orientation selectivity of the sidewall of the U-shaped recess 310 is performed on the Si substrate 300.

Wet etching having orientation selectivity is well known in the art. For example, the etching rate of <111> orientation is lower than that of other orientation.

Figure 3C:
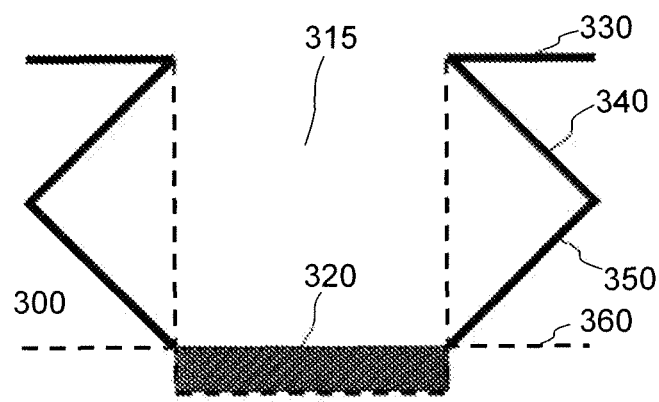

Accordingly, the wet etching will stop on the (111) and (11$\bar{1}$) crystal planes, consequently forming a Σ-shaped recess 315 as shown in FIG. 3C. In the cross-sectional view shown in FIG. 3C, a "Σ" shape is formed by the surface 330 of the substrate 300, the upper portion 340 and the lower portion 350 of the recess sidewalls, and the extending line 360 (denoted by dotted line) of the upper surface of the SiGe layer.

Further, the etchant used herein has a higher etching rate with respect to Si than SiGe. Those skilled in the art will appreciate that a variety of etchants can be selected.

As an example, Tetramethyl ammonium hydroxide (TMAH) can be adopted, which has an etching rate with respect to SiGe far lower than that with respect to Si. Experiment data of SiGe etching with TMAH is listed below in Table 1, wherein VDHF is diluent hydrofluoric acid (HF:H$_2$O=1:300~1:500).

TABLE 1

| Si and SiGe Etching Rate | | | | | | | |
|---|---|---|---|---|---|---|---|
| Before wet clean | | after VDHF clean for 300 s | | After 1$^{st}$ TMAH etching for 300 s | | After 2$^{st}$ TMAH etching for 300 s | |
| SiGe THK (Å) | Ge % | SiGe THK (Å) | Ge % | SiGe THK (Å) | Ge % | SiGe THK (Å) | Ge % |
| 563.26 | 19.44 | 560.53 | 19.44 | 532.25 | 19.52 | 504.2 | 19.6 |
| Delta (Å) | | 2.73 | | 28.28 | | 28.05 | |

After applying TMAH etching in two steps in sequence for 30 s respectively, 56.33 Å of SiGe of is removed (1 min total etching). In contrast, the etching rate of TMAH with respect to Si is about 500 Å/min.

Therefore, the SiGe layer 320 on the bottom of the U-shaped recess can serve as a blocking layer in the wet etching process to prevent the Si covered by the SiGe layer from being etched. The sidewalls not covered by the SiGe layer are etched to a Σ-shaped.

Thus, a Σ-shaped recess 315 having a substantively flat bottom surface is formed. Due to the existence of the SiGe layer 320, the prior art problem of forming a cuspate bottom is overcome.

Figure 3D:
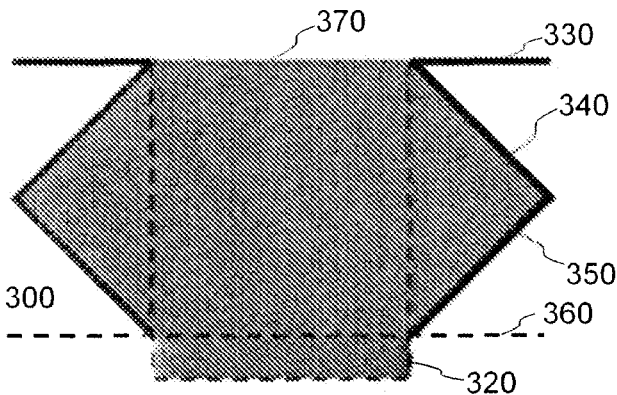

Next, at step 440, SiGe 370 is epitaxially grown to fill in the Σ-shaped recess 315 as shown in FIG. 3D. In this step, the SiGe layer 320 can be used as a seed layer.

The SiGe filled in the Σ-shaped recess 315 can be used to form source or drain regions of the PMOS device.

FIG. 3D schematically shows the Σ-shaped embedded SiGe source or drain regions of a semiconductor device manufactured incorporating features of the method of the invention.

As shown in FIG. 3D, a recess is formed in the Si substrate of the semiconductor device according. The recess is filled with SiGe material, and the SiGe material filled therein is used to form source or drain regions of the PMOS device.

The recess has a first portion (corresponding to the SiGe layer 320 formed through the first SiGe epitaxial growth) and a second portion (corresponding to the SiGe layer 370 formed through the second SiGe epitaxial growth).

The surface of substrate 300 and the sidewalls of first portion 320 comprise {100} or {110} crystal plane families and are substantially orthogonal to each other.

As described above, it is convenient if the surface of substrate 300 comprises a (001) crystal plane. When the channel direction has <110> orientation, the sidewalls of the first portion 320 may comprise a (110) crystal plane.

The second portion 370 is located above the first portion 320.

The sidewalls of the second portion 370 are divided into an upper part 340 and a lower part 350, which comprise (111) and (11$\bar{1}$) crystal planes respectively.

The height of the first portion 320 may be 10 Å to 300 Å.

The method of manufacturing semiconductor devices as well as semiconductor devices formed by such a method have been described in detail. Some details that are well known in the art are not discussed so as to not obscure the concept of this invention. Based on the above description, those skilled in the art can thoroughly understand how to implement the techniques disclosed herein.

Although some specific embodiments of this invention have been illustrated in detail by way of examples, those skilled in the art will appreciate that the above examples are merely illustrative and are not intended to limit the scope the embodiments of this invention. It should be understood by a person skilled in the art that the above embodiments can be modified without departing from the scope and spirit of the present invention. The scope of the present invention is defined by the attached claims.

What is claimed is:

1. A method of manufacturing semiconductor device, comprising:
   forming a U-shaped recess in a Si substrate;
   forming a SiGe layer on the bottom of the U-shaped recess through epitaxial growth;
   performing wet etching having orientation selectivity on said Si substrate from the sidewall of said U-shaped recess by using an etchant having a higher etching rate with respect to Si as compared to SiGe, so as to form a Σ-shaped recess;

wherein in the step of forming a SiGe layer on the bottom of said U-shaped recess through epitaxial growth, a SiGe thin film is also formed on the sidewall of said U-shaped recess, the thickness of which is less than the thickness of said SiGe layer on the bottom of said U-shaped recess, the method further comprising:

etching to remove said SiGe thin film before the wet etching of the Si substrate, while retaining at least a portion of said SiGe layer on the bottom of said U-shaped recess to cover the Si substrate at the bottom of said U-shaped recess;

wherein in said step of forming the SiGe layer on the bottom of said U-shaped recess through epitaxial growth comprise using one or more process gases chosen from the group consisting of:

$SiH_4$ or $SiH_2Cl_2$;
$GeH_4$;
HCl;
$B_2H_6$ or $BH_3$; and
$H_2$;

wherein the flow rate of $H_2$ is 0.1 slm to 50 slm, and the flow rates of the other process gases are 1 sccm to 1000 sccm.

2. The method according to claim 1, further comprising:
filling said Σ-shaped recess through epitaxial growth of SiGe in said Σ-shaped recess.

3. The method according to claim 2, wherein the SiGe filled in said Σ-shaped recess is used to form source or drain regions of a PMOS device.

4. The method according to claim 1, wherein said U-shaped recess is formed through a dry etching process.

5. The method according to claim 1, wherein the depth of said U-shaped recess is 300 Å to 550 Å.

6. The method according to claim 1, wherein the surface of said substrate and the sidewall of said U-shaped recess are ones selected among {100} and {110} crystal plane families and are orthogonal to each other, and in said wet etching having orientation selectivity, the etching rate of <111> orientation is lower than that of the other orientations.

7. The method according to claim 6, wherein the surface of said substrate is a (001) crystal plane, and the sidewall of said U-shaped is a (110) crystal plane.

8. The method according to claim 6, wherein said etchant comprises Tetramethyl ammonium hydroxide (TMAH).

9. The method according to claim 1 wherein, in said step of forming a SiGe layer on the bottom of said U-shaped recess through epitaxial growth, the process temperature is 500° C. to 800° C., and the process pressure is 5 Torr to 50 Torr.

10. The method according to claim 1, wherein the thickness of said SiGe layer is 10 Å to 300 Å.

11. A semiconductor device, comprising:
a Si substrate with a recess formed therein; and
SiGe material used to fill said recess to form source or drain regions of a PMOS device, wherein
said recess has a first portion and a second portion,
the surface of the substrate and the sidewall of said first portion are substantially ones selected among {100} and {110} crystal plane families and are substantially orthogonal to each other,
said second portion is located above said first portion, and
the sidewall of said second portion is divided into an upper part and a lower part, which are (111) and (11$\bar{1}$) crystal planes respectively.

12. The method according to claim 11, wherein the surface of said substrate is substantially a (001) crystal plane, and the sidewall of said first portion is substantially a (110) crystal plane.

13. The method according to claim 11, wherein the height of said first portion is 10 Å to 300 Å.

* * * * *